United States Patent
Tseng

(10) Patent No.: US 9,557,443 B2
(45) Date of Patent: Jan. 31, 2017

(54) PHOTOSENSITIVE RESIN COMPOSITION, BLACK MATRIX, COLOR FILTER, AND LIQUID CRYSTAL DISPLAY DEVICE

(71) Applicant: Chi Mei Corporation, Tainan (TW)

(72) Inventor: Ching-Yuan Tseng, Taoyuan County (TW)

(73) Assignee: Chi Mei Corporation, Tainan (TW)

( * ) Notice: Subject to any disclaimer, the term of this patent is extended or adjusted under 35 U.S.C. 154(b) by 54 days.

(21) Appl. No.: 14/303,582

(22) Filed: Jun. 12, 2014

(65) Prior Publication Data

US 2014/0374675 A1 Dec. 25, 2014

(30) Foreign Application Priority Data

Jun. 20, 2013 (TW) .............................. 102121982 A

(51) Int. Cl.

| | | |
|---|---|---|
| *G02B 5/23* | (2006.01) | |
| *G02B 1/04* | (2006.01) | |
| *C09B 1/00* | (2006.01) | |
| *G03F 7/00* | (2006.01) | |
| *G03F 7/027* | (2006.01) | |
| *G03F 7/038* | (2006.01) | |
| *G03F 7/105* | (2006.01) | |
| *C09B 67/20* | (2006.01) | |
| *C09B 67/46* | (2006.01) | |
| *G02F 1/1335* | (2006.01) | |
| *G03F 1/00* | (2012.01) | |
| *C09B 67/50* | (2006.01) | |
| *G02B 5/00* | (2006.01) | |

(52) U.S. Cl.
CPC . *G02B 1/04* (2013.01); *C09B 1/00* (2013.01); *C09B 67/009* (2013.01); *C09B 67/0063* (2013.01); *G03F 7/0007* (2013.01); *G03F 7/027* (2013.01); *G03F 7/0388* (2013.01); *G03F 7/105* (2013.01); *G02B 5/003* (2013.01)

(58) Field of Classification Search
USPC ...... 252/582, 586; 349/106; 359/885; 430/7, 430/270.1, 281.1, 321
See application file for complete search history.

(56) References Cited

U.S. PATENT DOCUMENTS

2008/0220372 A1* 9/2008 Lee et al. .................. 430/281.1
2012/0172480 A1* 7/2012 Kim et al. ....................... 522/77

FOREIGN PATENT DOCUMENTS

| JP | 2006-259716 | 9/2006 |
|---|---|---|
| JP | 2008-268854 | 11/2008 |
| JP | 2010204532 | 9/2010 |
| TW | 201205193 | 2/2012 |
| TW | 201319101 | 5/2013 |

OTHER PUBLICATIONS

"Office Action of Taiwan Counterpart Application", issued on Aug. 27, 2014, p. 1-p. 5.

* cited by examiner

*Primary Examiner* — Bijan Ahvazi
(74) *Attorney, Agent, or Firm* — Jianq Chyun IP Office

(57) ABSTRACT

A photosensitive resin composition, a black matrix, a color filter, and a liquid crystal display device including the resin composition are provided. The photosensitive resin composition includes an alkali-soluble resin (A), a compound (B) containing an ethylenically unsaturated group, a photo initiator (C), a solvent (D), and a black pigment (E). The compound (B) containing an ethylenically unsaturated group includes a compound (B-1) represented by the following formula (1).

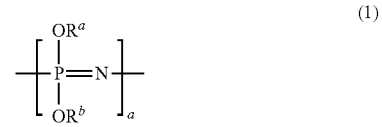

(1)

In formula (1), a represents an integer of 1 to 20; each of $R^a$ and $R^b$ independently represents an acryloyloxy phenyl group, an acryloyloxy alkyl group having 4 to 20 carbons, a methacryloyloxy phenyl group, a methacryloyloxy alkyl group having 5 to 20 carbons, an alkenyl group having 3 to 20 carbons, or an alkenyl aryl group having 8 to 30 carbons; when a is 2 or more, a plurality of $R^a$ and $R^b$ are the same or different.

12 Claims, No Drawings

PHOTOSENSITIVE RESIN COMPOSITION, BLACK MATRIX, COLOR FILTER, AND LIQUID CRYSTAL DISPLAY DEVICE

CROSS-REFERENCE TO RELATED APPLICATION

This application claims the priority benefit of Taiwan application serial no. 102121982, filed on Jun. 20, 2013. The entirety of the above-mentioned patent application is hereby incorporated by reference herein and made a part of this specification.

BACKGROUND OF THE INVENTION

Field of the Invention

The invention relates to a liquid crystal display material and an application thereof, and more particularly, to a photosensitive resin composition having good reliability under the conditions of high temperature and high humidity, and to a black matrix, a color filter, and a liquid crystal display device formed by using the composition.

Description of Related Art

In recent years, a variety of liquid crystal display techniques have been developed, and in order to improve the contrast and display quality of the current liquid crystal display device, a black matrix is usually disposed in the gap of the stripes and the dots of the color filter in the display device. The black matrix can prevent issues such as a decrease in contrast and color purity caused by light leakage between pixels. The material used in the conventional black matrix is mainly an evaporated film containing, for instance, chromium or chromium oxide. However, when the evaporated film is used as the material of the black matrix, disadvantages such as complicated process and costly materials exist. To solve these problems, a technique of forming the black matrix by a method of using a photosensitive resin composition through photolithography has previously been proposed.

Currently, the demand for the shading of the black matrix from the industry is increasing, and one solution is to increase the content of the black pigment, thereby improving the shading of the black matrix. For instance, JP 2006-259716 discloses a photosensitive resin composition for a black matrix. The photosensitive resin composition includes a high content of a black pigment, an alkali-soluble resin, a photopolymerization initiator, a reactive monomer having two functional groups, and an organic solvent. In particular, the reactive monomer having two functional groups can improve the reaction between compounds to form a pattern with high fineness. Therefore, in the photosensitive resin composition, when improving the shading by a method of increasing the content of the black pigment, the sensitivity of the photosensitive resin composition can still be maintained.

Further, JP 2008-268854 discloses a photosensitive resin composition for a black matrix. The photosensitive resin composition includes an alkali-soluble resin having a carboxylic acid group and an unsaturated group, a photopolymerized monomer having an ethylenically unsaturated group, a photopolymerization initiator, and a high content of black pigment. The photosensitive resin composition for a black matrix improves the resolution of the photosensitive resin composition having a high content of black pigment by using a specific alkali-soluble resin.

Although the current photosensitive resin composition having increased content of black pigment can increase shading, etc., the photosensitive resin composition of each prior art above readily generates issues such as poor reliability in an environment of high temperature and high humidity after lithography. Therefore, the development of a photosensitive resin composition for a black matrix having good reliability under the conditions of high temperature and high humidity is still required.

SUMMARY OF THE INVENTION

The invention provides a photosensitive resin composition for forming a black matrix, a color filter, and a liquid crystal display device. The photosensitive resin composition can improve the issue of the known photosensitive resin lacking reliability under the conditions of high temperature and high humidity.

The invention provides a photosensitive resin composition. The photosensitive resin composition includes an alkali-soluble resin (A), a compound (B) containing an ethylenically unsaturated group, a photo initiator (C), a solvent (D), and a black pigment (E). In particular, the compound (B) containing an ethylenically unsaturated group contains a compound (B-1) represented by the following formula (1).

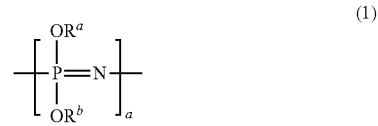

In formula (1), a represents an integer of 1 to 20; each of $R^a$ and $R^b$ independently represents an acryloyloxy phenyl group, an acryloyloxy alkyl group having 4 to 20 carbons, a methacryloyloxy phenyl group, a methacryloyloxy alkyl group having 5 to 20 carbons, an alkenyl group having 3 to 20 carbons, or an alkenyl aryl group having 8 to 30 carbons; when a is 2 or more, a plurality of $R^a$ and $R^b$ are the same or different.

In an embodiment of the invention, the alkali-soluble resin (A) can include a resin (A-1) having an unsaturated group, wherein the resin (A-1) having an unsaturated group is prepared by polymerizing a mixture, and the mixture contains an epoxy compound (i) having at least two epoxy groups and a compound (ii) having at least one carboxylic acid group and at least one ethylenically unsaturated group.

In an embodiment of the invention, the epoxy compound (i) having at least two epoxy groups may have a structure as shown in the following formula (I) or formula (II):

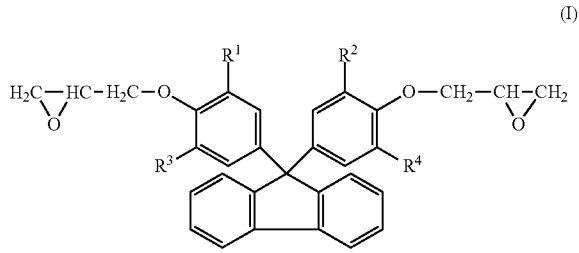

In formula (I), $R^1$, $R^2$, $R^3$ and $R^4$ are respectively the same or different and represent a hydrogen atom, a halogen atom, an alkyl group having 1 to 5 carbons, an alkoxy group having 1 to 5 carbons, an aryl group having 6 to 12 carbons, or an aralkyl group having 6 to 12 carbons.

acrylate. Likewise, the (meth)acryloyl group can represent an acryloyl group and/or a methacryloyl group. Furthermore, in the following, terms such as "an alkyl group having 1 to 5 carbons" imply the inclusion of an alkyl group having 1, 2, 3, 4, or 5 carbons. In the following, similar terms are explained in the same manner.

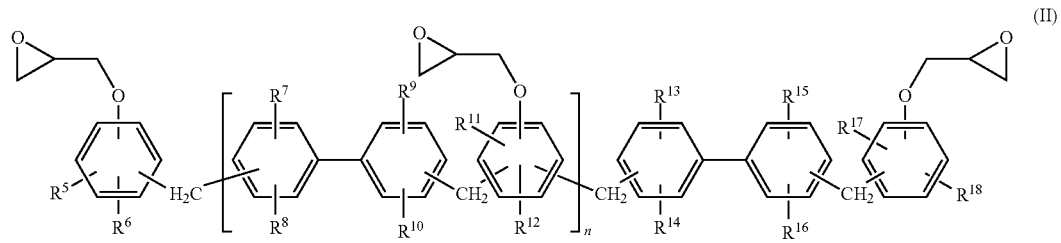

In formula (II), $R^5$ to $R^{18}$ are respectively the same or different and represent a hydrogen atom, a halogen atom, an alkyl group having 1 to 8 carbons, or an aryl group having 6 to 15 carbons, and n represents an integer of 0 to 10.

In an embodiment of the invention, in the photosensitive resin composition, based on 100 parts by weight of the alkali-soluble resin (A), the usage quantity of the compound (B) containing an ethylenically unsaturated group is, for instance, 20 to 200 parts by weight; the usage quantity of the photo initiator (C) is, for instance, 10 to 100 parts by weight; the usage quantity of the solvent (D) is, for instance, 1,000 to 5,000 parts by weight; and the usage quantity of the black pigment (E) is, for instance, 100 to 500 parts by weight.

In an embodiment of the invention, in the photosensitive resin composition, based on 100 parts by weight of the alkali-soluble resin (A), the usage quantity of the compound (B-1) containing an ethylenically unsaturated group, as shown in formula (I), is 10 to 150 parts by weight, for instance.

In an embodiment of the invention, in the photosensitive resin composition, based on 100 parts by weight of the alkali-soluble resin (A), the usage quantity of the resin (A-1) having an unsaturated group is, for instance, 30 to 100 parts by weight.

The invention further provides a black matrix. The black matrix is formed by the photosensitive resin composition described above.

The invention further provides a color filter. The color filter contains the black matrix described above.

The invention further provides a liquid crystal display device. The liquid crystal display device contains the color filter described above.

Based on the above, the photosensitive resin composition has good reliability under the conditions of high temperature and high humidity and is suitable for preparing the black matrix, the color filter, and the liquid crystal display device.

To make the above features and advantages of the invention more comprehensible, several embodiments are described in detail as follows.

DESCRIPTION OF THE EMBODIMENTS

Photosensitive Resin Composition

The photosensitive resin composition of the invention includes an alkali-soluble resin (A), a compound (B) having an ethylenically unsaturated group, a photo initiator (C), a solvent (D), and a black pigment (E). In the following, the detailed composition of each component is specifically described.

It should be understood that, in the following, (meth) acrylic acid can represent acrylic acid and/or methacrylic acid, and (meth)acrylate can represent acrylate and/or meth- Further, in the following, groups such as the alkyl group may be further substituted by a substituent. The "number of carbons" of groups such as the alkyl group represents the number of carbons of the entire substituted or unsubstituted group. Furthermore, a group that is not specified as substituted or unsubstituted is meant to include both substituted and unsubstituted forms of the group.

Alkali-Soluble Resin (A)

The alkali-soluble resin (A) of the invention can contain a resin (A-1) having an unsaturated group, and the resin (A-1) having an unsaturated group is, for instance, prepared from a polymerization performed on a mixture, and the mixture can contain an epoxy compound (i) having at least two epoxy groups and a compound (ii) having at least one carboxylic acid group and at least one ethylenically unsaturated group. Moreover, the mixture can further optionally contain a carboxylic anhydride compound (iii) and/or a compound (iv) containing an epoxy group.

(1) Resin (A-1) Having an Unsaturated Group (1.1) Epoxy Compound (i) Having at Least Two Epoxy Groups The epoxy compound (i) having at least two epoxy groups can have the structure as shown in the following formula (I) or formula (II). Here, the description of "the epoxy compound (i) having at least two epoxy groups can have the structure as shown in the following formula (I) or formula (II)" also includes the situation in which the compound having the structure as shown in following formula (I) and the compound having the structure as shown in following formula (II) are both present and act as the epoxy compound (i). Specifically, the epoxy compound (i) having at least two epoxy groups can have, for instance, the structure as shown in the following formula (I):

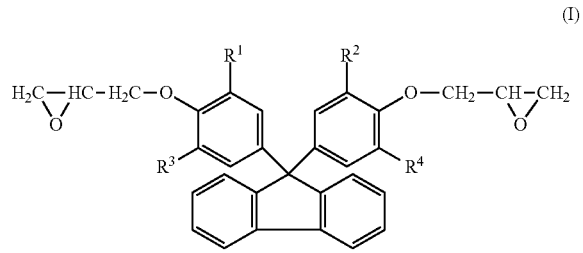

In formula (I), $R^1$, $R^2$, $R^3$ and $R^4$ are respectively the same or different and represent a hydrogen atom, a halogen atom, an alkyl group having 1 to 5 carbons, an alkoxy group having 1 to 5 carbons, an aryl group having 6 to 12 carbons, or an aralkyl group having 6 to 12 carbons.

The epoxy compound (i) having at least two epoxy groups of formula (I) can include an epoxy-containing bisphenol fluorene-type compound obtained from a reaction between a bisphenol fluorene-type compound and an epihalohydrin, but is not limited thereto.

Specific examples of the bisphenol fluorene-type compound are, for instance, compounds such as 9,9-bis(4-hydroxyphenyl)fluorene, 9,9-bis(4-hydroxy-3-methylphenyl)fluorene, 9,9-bis(4-hydroxy-3-chlorophenyl)fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, and 9,9-bis(4-hydroxy-3,5-dibromophenyl)fluorene.

The epihalohydrin can include, but not limited to, for instance, epichlorohydrin or epibromohydrin.

The epoxy-containing bisphenol fluorene-type compound obtained from a reaction between a bisphenol fluorene-type compound and an epihalohydrin contains, but is not limited to, (1) products such as ESF-300 manufactured by Nippon Steel Chemical Co., Ltd; (2) products such as PG-100 and EG-210 manufactured by Osaka Gas Co., Ltd; and (3) products such as SMS-F9PhPG, SMS-F9CrG, and SMS-F914PG manufactured by S.M.S Technology Co., Ltd.

Moreover, the epoxy compound (I) having at least two epoxy groups can also have the structure as shown in the following formula (II):

In formula (II-1), the definition of each of $R^5$ to $R^{18}$ and n is respectively the same as the definition of each of $R^5$ to $R^{18}$ and n in formula (II) and are not repeated herein.

Further, the epoxy compound (i) having at least two epoxy groups of formula (II) is formed by, for instance, performing a condensation reaction between a compound having the structure as shown in the following formula (II-2) and a phenol to form a compound having the structure as shown in formula (II-1) in the presence of an acid catalyst. Next, a dehydrohalogenation reaction is performed by adding an excess amount of an epihalohydrin to obtain the epoxy compound (i) having at least two epoxy groups as shown in formula (II):

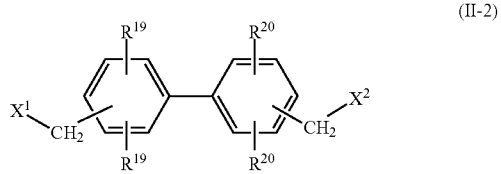

(II-2)

In the above formula (II-2), $R^{19}$ and $R^{20}$ are respectively the same or different hydrogen atoms, halogen atoms, alkyl groups having 1 to 8 carbons, or aryl groups having 6 to 15 carbons, and $X^1$ and $X^2$ are respectively the same or different halogen atoms, alkyl groups having 1 to 6 carbons, or alkoxy groups having 1 to 6 carbons. Preferably, the halogen atom

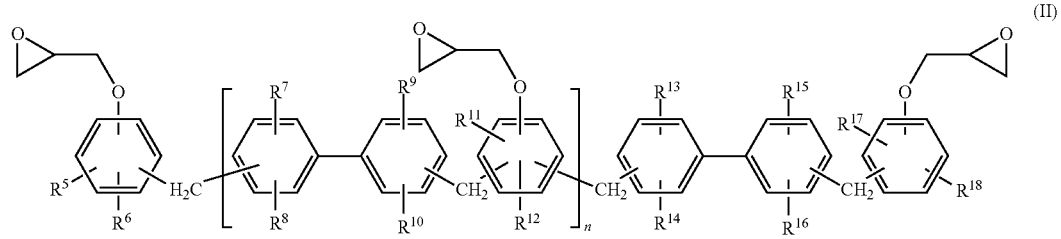

(II)

In formula (II), $R^5$ to $R^{18}$ are respectively the same or different and represent a hydrogen atom, a halogen atom, an alkyl group having 1 to 8 carbons, and an aryl group having 6 to 15 carbons, and n represents an integer of 0 to 10.

The epoxy compound (i) having at least two epoxy groups of formula (II) is, for instance, obtained from a reaction between a compound having the structure as shown in the following formula (II-1) and an epihalohydrin in the presence of an alkali metal hydroxide.

can be, for instance, chlorine or bromine; the alkyl group can be, for instance, a methyl group, an ethyl group, or a t-butyl group; and the alkoxy group can be, for instance, a methoxy group or an ethoxy group.

Specific examples of the phenol are, for instance, phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethi-

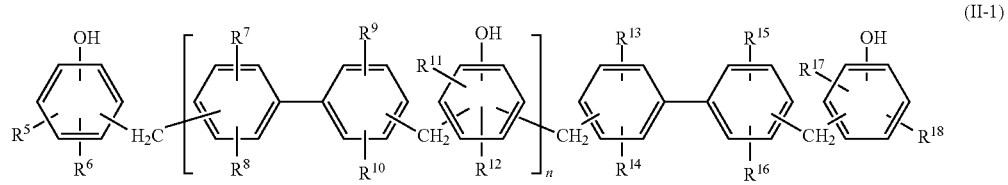

(II-1)

nylphenol, cyclopentylphenol, cyclohexylphenol, and cyclohexylcresol. The phenol can generally be used individually or in combination.

Based on the usage quantity of 1 mole of the compound having the structure of formula (II-2), the usage quantity of the phenol is 0.5 moles to 20 moles, preferably 2 moles to 15 moles.

Specific examples of the acid catalyst are, for instance, hydrochloric acid, sulfuric acid, p-toluenesulfonic acid, oxalic acid, boron trifluoride, aluminium chloride anhydrous, and zinc chloride, wherein p-toluenesulfonic acid, sulfuric acid, and hydrochloric acid are preferred. The acid catalyst can be used individually or in combination.

Further, even though the usage quantity of the acid catalyst is not particularly limited, based on a usage quantity of 100 wt % of the compound having the structure of formula (II-2), the usage quantity of the acid catalyst is preferably 0.1 wt % to 30 wt %.

The condensation reaction can be performed in the absence of a solvent or in the presence of an organic solvent. Further, specific examples of the organic solvent are, for instance, toluene, xylene, and methyl isobutyl ketone. The organic solvent can be used individually or in combination.

Based on a total weight of 100 wt % of the compound having the structure of formula (II-2) and the phenol, the usage quantity of the organic solvent is 50 wt % to 300 wt %, wherein 100 wt % to 250 wt % is preferred. Further, the condensation reaction is performed at an operating temperature of 40° C. to 180° C. and the operating time of the condensation reaction is 1 hour to 8 hours.

After the condensation reaction is completed, a neutralization treatment or a rinsing treatment can be performed. The neutralization treatment adjusts the pH value of the reacted solution to pH 3 to pH 7, preferably to pH 5 to pH 7. The rinsing treatment can be performed by using a neutralizing agent. The neutralizing agent is a basic material, and specific examples of the neutralizing agent are, for instance, alkali metal hydroxides such as sodium hydroxide and potassium hydroxide; alkaline earth metal hydroxides such as calcium hydroxide and magnesium hydroxide; organic amines such as diethylene triamine, triethylenetramine, aniline, and phenylene diamine; and ammonia and sodium dihydrogen phosphate. The rinsing treatment can be performed with a known method, such as by adding an aqueous solution containing a neutralizing agent to the reacted solution and then repeatedly extracting. After the neutralization treatment or the rinsing treatment, the unreacted phenol and solvent are distilled off by a heat treatment at reduced pressure and condensed to obtain the compound having the structure of formula (II-1).

Specific examples of the epihalohydrin are, for instance, 3-chloro-1,2-epoxypropane, 3-bromo-1,2-epoxypropane, or any combination thereof. Before performing the dehydrohalogenation, an alkali metal hydroxide such as sodium hydroxide and potassium hydroxide can be added prior to or during the reaction. The operating temperature of the dehydrohalogenation reaction is 20° C. to 120° C. and the operating time thereof is 1 hour to 10 hours.

In an embodiment, the alkali metal hydroxide added in the dehydrohalogenation reaction can also be used as an aqueous solution thereof. In the present embodiment, when the aqueous solution of the alkali metal hydroxide is continuously added to the reaction system of the dehydrohalogenation reaction, water and an epihalohydrin can be continuously distilled at the same time at reduced or normal pressure to separate and remove water while the epihalohydrin is continuously recycled back to the reaction system.

Before the dehydrohalogenation reaction is performed, a quaternary ammonium salt such as tetramethyl ammonium chloride, tetramethyl ammonium bromide, and trimethyl benzyl ammonium chloride can also be added as a catalyst to react at 50° C. to 150° C. for 1 hour to 5 hours. Then, the alkali metal hydroxide or an aqueous solution thereof is added to react for 1 hour to 10 hours at a temperature of 20° C. to 120° C. to perform the dehydrohalogenation reaction.

Based on a total equivalent of 1 equivalent of the hydroxyl group in the compound having the structure of formula (II-1), the usage quantity of the epihalohydrin can be 1 equivalent to 20 equivalents, preferably 2 equivalents to 10 equivalents. Based on a total equivalent of 1 equivalent of the hydroxyl group in the compound having the structure of formula (II-1), the usage quantity of the alkali metal hydroxide added in the dehydrohalogenation reaction can be 0.8 equivalents to 15 equivalents, preferably 0.9 equivalents to 11 equivalents.

Additionally, in order to facilitate the dehydrohalogenation reaction, in addition to adding an alcohol such as methanol and ethanol, an aprotic polar solvent such as dimethyl sulfone and dimethyl sulfoxide can also be added to perform the reaction. When an alcohol is used, based on a total amount of 100 wt % of the epihalohydrin, the usage quantity of the alcohol can be 2 wt % to 20 wt %, preferably 4 wt % to 15 wt %. In an example of using the aprotic polar solvent, based on a total amount of 100 wt % of the epihalohydrin, the usage quantity of the polar solvent can be 5 wt % to 100 wt %, preferably 10 wt % to 90 wt %.

After the dehydrohalogenation reaction is completed, a rinsing treatment can be optionally performed, followed by removing the epihalohydrin, alcohol, and aprotic polar solvent, etc. by a method of heating under reduced pressure. The heating under reduced pressure is performed in, for instance, an environment of a temperature of 110° C. to 250° C. and a pressure of 1.3 kPa (10 mmHg) or less.

In order to prevent the epoxy resin formed from containing a hydrolysable halogen, solvents such as toluene and methyl isobutyl ketone can be added in the solution after the dehydrohalogenation reaction, and the alkali metal hydroxide such as sodium hydroxide and potassium hydroxide can be added to further perform a dehydrohalogenation reaction again. In the dehydrohalogenation reaction, based on a total equivalent of 1 equivalent of the hydroxyl group in the compound having the structure of formula (II-1), the usage quantity of the alkali metal hydroxide is 0.01 moles to 0.3 moles, preferably 0.05 moles to 0.2 moles. Further, the operating temperature of the dehydrohalogenation reaction ranges from 50° C. to 120° C. and the operating time ranges from 0.5 hours to 2 hours.

After the dehydrohalogenation reaction is completed, the salt is removed by steps such as filtration and washing. Additionally, solvents such as toluene and methyl isobutyl ketone can be distilled off by a method of heating under reduced pressure to obtain the epoxy compound (i) having at least two epoxy groups represented by formula (II). The epoxy compound (i) having at least two epoxy groups represented by formula (II) can contain, but not limited to, products manufactured by Nippon Kayaku Co. Ltd. such as NC-3000, NC-3000H, NC-3000S, and NC-3000P.

(1.2) Compound (ii) Having at Least One Carboxylic Group and at Least One Ethylenically Unsaturated Group The compound (ii) having at least one carboxylic group and at least one ethylenically unsaturated group is, for instance, selected from the group consisting of the following (1) to (3): (1) acrylic acid, methacrylic acid, 2-methacryloyloxyethylbutanedioic acid, 2-methacryloyloxybutylbutanedioic acid, 2-methacryloyloxyethylhexanedioic acid, 2-methacryloyloxybutylhexanedioic acid, 2-methacryloyloxyethylhexahydrophthalic acid, 2-methacryloyloxyethylmaleic acid, 2-methacryloyloxypropylmaleic acid, 2-methacryloyloxybutylmaleic acid, 2-methacryloyloxypropylbutanedioic acid, 2-methacryloyloxypropylhexanedioic acid, 2-methacryloyloxypropyltetrahydrophthalic acid, 2-methacryloyloxypropylphthalic acid, 2-methacryloyloxybutylphthalic acid, or 2-methacryloyloxybutylhydrophthalic acid; (2) a compound obtained from a reaction between a hydroxyl-containing (meth)acrylate and a dicarboxylic acid compound, wherein the dicarboxylic acid compound contains, but is not limited to hexanedioic acid, butanedioic acid, maleic acid, and phthalic acid; and (3) a hemiester compound obtained from a reaction between a hydroxyl-containing (meth)acrylate and the carboxylic anhydride compound(iii), wherein the hydroxyl-containing (meth)acrylate contains, but is not limited to, (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, or pentaerythritol tri(meth)acrylate. Further, the carboxylic anhydride compound can be the same as the carboxylic anhydride compound (iii) contained in the mixture of the resin (A-1) having an unsaturated group and is not repeated herein.

(1.3) Carboxylic Anhydride Compound (iii) and Compound (iv) Containing an Epoxy Group The mixture of the resin (A-1) having an unsaturated group can optionally contain the carboxylic anhydride compound (iii) and/or the compound (iv) containing an epoxy group. The carboxylic anhydride compound (iii) can be selected from the group consisting of the following (1) to (2): (1) dicarboxylic anhydride compounds such as butanedioic anhydride, maleic anhydride, itaconic anhydride, phthalic anhydride, tetrahydrophthalic anhydride, hexahydrophthalic anhydride, methyl tetrahydrophthalic anhydride, methylhexahydrophthalic anhydride, methyl endo-methylene tetrahydrophthalic anhydride, chlorendic anhydride, glutaric anhydride and 1,3-dioxoisobenzofuran-5-carboxylic acid and (2) tetracarboxylic dianhydride compounds such as benzophenone tetracarboxylic dianhydride (referred to as BTDA), biphenyl tetracarboxylic dianhydride, and 4,4'-oxydiphthalic anhydride.

The compound (iv) containing an epoxy group is selected from, for instance, glycidyl methacrylate, 3,4-epoxycyclohexylmethacrylate, glycidyl ether containing an unsaturated group, an unsaturated compound containing an epoxy group, or any combination thereof. The glycidyl ether containing an unsaturated group contains, but is not limited to, compounds having the product names of, for instance, Denacol EX-111, EX-121 Denacol, Denacol EX-141, Denacol EX-145, Denacol EX-146, Denacol EX-171, and Denacol EX-192 (products of Nagase Chemtex).

The resin (A-1) having an unsaturated group can be obtained by performing a polymerization reaction between the epoxy compound (i) having at least two epoxy groups of formula (I) and the compound (ii) having at least one carboxylic group and at least one ethylenically unsaturated group to form a hydroxyl-containing reaction product, followed by adding the carboxylic anhydride compound (iii) to perform a reaction. Based on a total equivalent of 1 equivalent of the hydroxyl group in the hydroxyl-containing reaction product, the equivalent of the anhydride group contained in the carboxylic anhydride compound (iii) is preferably 0.4 equivalents to 1 equivalent, and more preferably 0.75 equivalents to 1 equivalent. When a plurality of the carboxylic anhydride compounds (iii) are used, the plurality of the carboxylic anhydride compounds (iii) can be added in sequence or at the same time. When a dicarboxylic anhydride compound and a tetracarboxylic anhydride compound are used as the carboxylic anhydride compound (iii), the molar ratio of the dicarboxylic anhydride compound to the tetracarboxylic anhydride compound is preferably 1/99 to 90/10, and more preferably 5/95 to 80/20. Further, the operating temperature of the reaction ranges from, for instance, 50° C. to 130° C.

The resin (A-1) having an unsaturated group can be obtained by performing a reaction between the epoxy compound (i) having at least two epoxy groups of formula (II) and the compound (ii) having at least one carboxylic group and at least one ethylenically unsaturated group to form a hydroxyl-containing product, followed by adding the carboxylic anhydride compound (iii) and/or the compound (iv) containing an epoxy group to perform a polymerization reaction. Based on a total equivalent of 1 equivalent of the epoxy compound (i) having at least two epoxy groups of formula (II), the equivalent of the acid value of the compound (ii) having at least one carboxylic group and at least one ethylenically unsaturated group is preferably 0.8 equivalents to 1.5 equivalents, and more preferably 0.9 equivalents to 1.1 equivalents. Based on a total amount of 100 mole % of the hydroxyl group of the hydroxyl-containing reaction product, the usage quantity of the carboxylic anhydride compound (iii) is preferably 10 mole % to 100 mole %, more preferably 20 mole % to 100 mole %, and even more preferably 30 mole % to 100 mole %.

When preparing the resin (A-1) having an unsaturated group, a basic compound is often added in the reaction solution as a reaction catalyst to accelerate the reaction. The reaction catalyst can be used individually or in combination, and the reaction catalyst contains, but is not limited to, for instance, triphenyl phosphine, triphenyl stibine, triethylamine, triethanolamine, tetramethylammonium chloride, and benzyltriethylammonium chloride. Based on a total weight of 100 parts by weight of the epoxy compound (i) having at least two epoxy groups and the compound (ii) having at least one carboxylic group and at least one ethylenically unsaturated group, the usage quantity of the reaction catalyst is preferably 0.01 parts by weight to 10 parts by weight, and more preferably 0.3 parts by weight to 5 parts by weight.

Additionally, to control the degree of polymerization, a polymerization inhibitor is often added in the reaction solution. The polymerization inhibitor can contain, but not limited to, for instance, methoxyphenol, methylhydroquinone, hydroquinone, 2,6-di-t-butyl-p-cresol, or phenothiazine. Generally, the polymerization inhibitor can be used individually or in combination. Based on a total weight of 100 parts by weight of the epoxy compound (i) having at least two epoxy groups and the compound (ii) having at least one carboxylic group and at least one ethylenically unsaturated group, the usage quantity of the polymerization inhibitor is preferably 0.01 parts by weight to 10 parts by weight, and more preferably 0.1 parts by weight to 5 parts by weight.

When preparing the resin (A-1) having an unsaturated group, a polymerization reaction solvent can be used if needed. Specific examples of the polymerization reaction solvent are, for instance, alcohol compounds such as ethanol, propanol, iso-propanol, butanol, iso-butanol, 2-butanol, hexanol, and ethylene glycol; ketone compounds such as methyl ethyl ketone and cyclohexyl ketone; aromatic hydrocarbon compounds such as toluene and xylene; cellosolve compounds such as cellosolve and butyl cellosolve; carbitol compounds such as carbitol and butyl carbitol; propylene glycol alkyl ether compounds such as propylene glycol monomethyl ether; poly(propylene glycol) alkyl ether compounds such as di(propylene glycol) methyl ether; acetate compounds such as ethyl acetate, butyl acetate, ethylene glycol monoethyl ether acetate, and propylene glycol methyl ether acetate; alkyl lactate compounds such as ethyl lactate and butyl lactate; and dialkyl glycol ethers. The polymerization reaction solvent can generally be used individually or in combination. Further, the acid value of the resin (A-1) having an unsaturated group is preferably 50 mgKOH/g to 200 mgKOH/g, and more preferably 60 mgKOH/g to 150 mgKOH/g.

Based on a usage quantity of 100 parts by weight of the alkali-soluble resin (A), the usage quantity of the resin (A-1) having an unsaturated group is preferably 30 parts by weight to 100 parts by weight, more preferably 50 parts by weight to 100 parts by weight, and even more preferably 70 parts by weight to 100 parts by weight. If the resin (A-1) having an unsaturated group is not used at all, then the photosensitive resin composition may have disadvantages such as poor adhesion after development and poor heat-resistance of the pattern after a post-bake treatment. Additionally, by adding the resin (A-1) having an unsaturated group in the photosensitive resin composition of the invention, the reliability under the conditions of high temperature and high humidity can be further improved.

(2) Other Alkali-Soluble Resin(s) (A-2)

The alkali-soluble resin (A) can optionally include other alkali-soluble resin(s) (A-2). The other alkali-soluble resin(s) (A-2) contains, but are not limited to, resins containing a carboxylic group or a hydroxyl group, specifically resins such as acrylic resins other than the resin (A-1) having an unsaturated group, urethane resins, and novolac resins.

Based on a total amount of 100 parts by weight of the alkali-soluble resin (A), the usage quantity of the other alkali-soluble resin(s) (A-2) is preferably 0 parts by weight to 70 parts by weight, more preferably 0 parts by weight to 50 parts by weight, and even more preferably 0 parts by weight to 30 parts by weight.

Compound (B) Containing an Ethylenically Unsaturated Group

The compound (B) containing an ethylenically unsaturated group contains a compound (B-1) containing an ethylenically unsaturated group. Additionally, the compound (B) containing an ethylenically unsaturated group can optionally contain other compound(s) (B-2) containing an ethylenically unsaturated group.

(1) Compound (B-1) Containing an Ethylenically Unsaturated Group

The compound (B-1) containing an ethylenically unsaturated group has the structure as shown in the following formula (1).

(1)

In formula (1), a represents an integer of 1 to 20; each of $R^a$ and $R^b$ independently represents an acryloyloxy phenyl group, an acryloyloxy alkyl group having 4 to 20 carbons, a methacryloyloxy phenyl group, a methacryloyloxy alkyl group having 5 to 20 carbons, an alkenyl group having 3 to 20 carbons, or an alkenyl aryl group having 8 to 30 carbons; when a is 2 or more, a plurality of $R^a$ and $R^b$ are respectively the same or different.

The acryloyloxy alkyl group having 4 to 20 carbons is, for instance, an acryloyloxy methyl group, an acryloyloxy ethyl group, an acryloyloxy propyl group, or an acryloyloxy butyl group; the methacryloyloxy alkyl group having 5 to 20 carbons is, for instance, a methacryloyloxy methyl group, a methacryloyloxy ethyl group, a methacryloyloxy propyl group, or a methacryloyloxy butyl group; the alkenyl group having 3 to 20 carbons is, for instance, a propenyl group, an iso-propenyl group, a butenyl group, a pentenyl group, or a hexenyl group; the alkenyl aryl group is, for instance, a phenyl propenyl group, a phenyl butenyl group, a phenyl pentenyl group, a tolyl propenyl group, a tolyl butenyl group, or a tolyl pentenyl group. However, the invention is not limited thereto.

Additionally, from the standpoint of further improving the developability and resolution, $R^a$ and $R^b$ are preferably an acryloyloxy alkyl group having 4 to 20 carbons and a methacryloyloxy alkyl group having 5 to 20 carbons.

Specific examples of the compound (B-1) containing an ethylenically unsaturated group are compounds such as 2,2,4,4,6,6-hexa[2-(methacryloyloxy)-phenoxy]-cyclotriphosphazene, 2,2,4,4,6,6-hexa[2-(acryloyloxy)-phenoxy]-cyclotriphosphazene, 2,2,4,4,6,6-hexa[2-(methacryloyloxy)-methoxy]-cyclotriphosphazene, 2,2,4,4,6,6-hexa[2-(acryloyloxy)-methoxy]-cyclotriphosphazene, 2,2,4,4,6,6-hexa[2-(methacryloyloxy)-ethoxy]-cyclotriphosphazene (PPZ, manufactured by Kyoeisha Chemical Co., Ltd.), 2,2,4,4,6,6-hexa[2-(acryloyloxy)-ethoxy]-cyclotriphosphazene, 2,2,4,4,6,6-hexa[2-(methacryloyloxy)-propenyloxy]-cyclotriphosphazene), 2,2,4,4,6,6-hexa[2-(acryloyloxy)-propenyloxy]-cyclotriphosphazene, 2,2,4,4,6,6-hexa[2-(methacryloyloxy)-propenylphenoxy]-cyclotriphosphazene), and 2,2,4,4,6,6-hexa[2-(acryloyloxy)-propenylphenoxy]-cyclotriphosphazene, but are not in actuality limited thereto.

Based on 100 parts by weight of the alkali-soluble resin (A), the usage quantity of the compound (B-1) containing an ethylenically unsaturated group represented by formula (1) is preferably 10 parts by weight to 150 parts by weight, more preferably 15 parts by weight to 120 parts by weight, and even more preferably 20 parts by weight to 100 parts by weight. If the compound (B-1) containing an ethylenically unsaturated group represented by formula (1) is not used at all in the photosensitive resin composition, disadvantages such as poor reliability under the conditions of high temperature and high humidity may result.

The reason presumably is that the compound (B-1) containing an ethylenically unsaturated group has P and N structures, and therefore adhesion between a mother glass and the resin, and between ITO and the resin can be effectively increased. The occurrence of a swelling phenomenon can also be decreased to effectively and significantly improve the reliability of the photosensitive resin composition under the conditions of high temperature and high humidity.

(2) Other Compound(s) (B-2) Containing an Ethylenically Unsaturated Group

The other compound(s) (B-2) containing an ethylenically unsaturated group can be selected from a compound having one ethylenically unsaturated group or a compound having two or more (including two) ethylenically unsaturated groups.

The compound having one ethylenically unsaturated group can contain, but not limited to, for instance, (meth) acrylamide, (meth)acryloylmorpholine, 7-amino-3,7-dimethyloctyl(meth)acrylate, isobutoxymethyl(meth)acrylamide isobutoxymethyl(meth)acrylamide, isobornyloxyethyl (meth)acrylate, isobornyl(meth)acrylate, 2-ethylhexyl (meth)acrylate, ethyl diethylene glycol(meth)acrylate, t-octyl(meth)acrylamide, diacetone(meth)acrylamide, dimethylaminoethyl(meth)acrylate, dodecyl(meth)acrylate, dicyclopentenyloxyethyl(meth)acrylate, dicyclopentenyl (meth)acrylate, N,N-dimethyl(meth)acrylamide, tetrachlorophenyl(meth)acrylate, 2-tetrachlorophenoxy ethyl(meth) acrylate, tetrahydrofurfuryl(meth)acrylate, tetrabromophenyl(meth)acrylate, 2-tetrabromophenoxyethyl(meth)acrylate, 2-trichlorophenoxyethyl(meth)acrylate, tribromophenyl(meth)acrylate, 2-tribromophenoxyethyl(meth)acrylate, 2-hydroxyethyl(meth)acrylate, 2-hydroxypropyl(meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth)acrylate, or bornyl(meth)acrylate. The compound (B-2) containing an ethylenically unsaturated group can generally be used individually or in combination.

The compound having two or more (including two) ethylenically unsaturated groups can contain, but not limited to, for instance, ethylene glycol di(meth)acrylate, dicyclopentenyl di(meth)acrylate, triethylene glycol di(meth)acrylate, tetraethylene glycol di(meth)acrylate, tri(2-hydroxyethyl)isocyanate di(meth)acrylate, tri(2-hydroxyethyl) isocyanate tri(meth)acrylate, caprolactone-modified tri(2-hydroxyethyl)isocyanate tri(meth)acrylate, trimethylolpropyl tri(meth)acrylate, ethylene oxide (referred to as EO) modified trimethylolpropyl tri(meth)acrylate, propylene oxide (referred to as PO) modified trimethylolpropyl tri(meth)acrylate, tripropylene glycol di(meth)acrylate, neopentyl glycol di(meth)acrylate, 1,4-butanediol di(meth)acrylate, 1,6-hexanediol di(meth)acrylate, pentaerythritol tri(meth)acrylate, pentaerythritol tetra(meth)acrylate, polyester di(meth)acrylate, polyethylene glycol di(meth) acrylate, dipentaerythritol hexa(meth)acrylate (DPHA), dipentaerythritol penta(meth)acrylate, dipentaerythritol tetra (meth)acrylate, caprolactone-modified dipentaerythritol hexa(meth)acrylate, caprolactone-modified dipentaerythritol penta(meth)acrylate, ditrimethylolpropyl tetra(meth) acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, or phenol novolac polyglycidyl ether (meth) acrylate. The compound (B-2) having two or more (including two) ethylenically unsaturated groups can generally be used individually or in combination.

Specific examples of the compound (B) containing an ethylenically unsaturated group are, for instance, trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate, or any combination thereof.

Based on a total amount of 100 parts by weight of the alkali-soluble resin (A), the usage quantity of the compound (B) containing an ethylenically unsaturated group is preferably 20 parts by weight to 200 parts by weight, more preferably 30 parts by weight to 170 parts by weight, and even more preferably 40 parts by weight to 150 parts by weight. Therefore, the photosensitive resin composition can have good developability.

Photo Initiator (C)

The photo initiator (C) of the invention is not particularly limited and can contain, but not limited to, for instance, O-oxime compound, triazine compound, acetophenone compound, biimidazole compound, benzophenone compound, a-diketone compound, ketone alcohol compound, ketone alcohol ether compound, acylphosphine oxide compound, quinone compound, halogen-containing compound, or peroxide.

Specific examples of the O-oxime compound are, for instance, 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-octane-1,2-dione 2-(O-benzoyloxime), 1-[9-ethyl-6-(2-methylbenzoyl)-9H-carbazol-3-yl]-ethanone 1-(O-acetyloxime), 1-[9-ethyl-6-(3-methylbenzoyl)-9H-carbazol-3-yl]-ethanone 1-(O-acetyloxime), 1-[9-ethyl-6-benzoyl-9H-carbazol-3-yl] ethanone 1-(O-acetyloxime), ethanone-1-[9-ethyl-6-(2-methyl-4-(tetrahydrofuran)benzoyl)-9H-carbazol-3-yl]-1-(O-acetyloxime), ethanone-1-[9-ethyl-6-(2-methyl-4-(tetrahydropyranyl)benzoyl)-9H-carbazol-3-yl]-1-(O-acetyloxime), ethanone-1-[9-ethyl-6-(2-methyl-5-(tetrahydrofuran)benzoyl)-9H-carbazol-3-yl]-1-(O-acetyloxime), ethanone-1-[9-ethyl-6-(2-methyl-5-(tetrahydropyranyl)benzoyl)-9H-carbazol-3-yl]-1-(O-acetyloxime), ethanone-1-[9-ethyl-6-(2-methyl-4-(tetrahydrofuran)methoxybenzoyl)-9H-carbazol-3-yl]-1-(O-acetyloxime), ethanone-1-[9-ethyl-6-(2-methyl-4-(tetrahydropyranyl)methoxybenzoyl)-9H-carbazol-3-yl]-1-(O-acetyloxime), ethanone-1-[9-ethyl-6-(2-methyl-5-(tetrahydrofuran)methoxybenzoyl)-9H-carbazol-3-yl]-1-(O-acetyloxime), ethanone-1-[9-ethyl-6-(2-methyl-5-(tetrahydropyranyl)methoxybenzoyl)-9H-carbazol-3-yl]-1-(O-acetyloxime), ethanone-1-[9-ethyl-6-{2-methyl-4-(2,2-dimethyl-1,3-dioxolan)benzoyl}-9H-carbazol-3-yl]-1-(O-acetyloxime), and ethanone-1-[9-ethyl-6-{2-methyl-4-(2,2-dimethyl-1,3-dioxolan)methoxybenzoyl}-9H-carbazol-3-yl]-1-(O-acetyloxime).

The O-oxime compound is preferably 1-[4-(phenylthio) phenyl]-octane-1,2-dione 2-(O-benzoyloxime) (such as OXE 01 manufactured by Ciba Specialty Chemicals), 1-[9-ethyl-6-(2-methylbenzoyl)-9H-carbazol-3-yl]-ethanone 1-(O-acetyloxime) (such as OXE 02 manufactured by Ciba Specialty Chemicals), ethanone-1-[9-ethyl-6-(2-methyl-4-(tetrahydropyranyl)methoxybenzoyl)-9H-carbazol-3-yl]-1-(O-acetyloxime), or ethanone-1-[9-ethyl-6-{2-methyl-4-(2,2-dimethyl-1,3-dioxolan)methoxybenzoyl}-9H-carbazol-3-yl]-1-(O-acetyloxime). The O-oxime compound can be used individually or in combination, depending on actual demand.

The triazine compound can contain, but not limited to, for instance, a vinyl-halogenated methyl-s-triazine compound, a 2-(naphtho-1-yl)-4,6-bis-halogenated methyl-s-triazine compound, or a 4-(p-aminophenyl)-2,6-bi-halogenated methyl-s-triazine compound.

Specific examples of the vinyl group-halogenated methyl-s-triazine compound are, for instance, 2,4-bis(trichloromethyl)-6-(p-methoxy)styryl-s-triazine, 2,4-bis(trichloromethyl)-3-(1-p-dimethylaminophenyl-1,3-butadiene group)-s-triazine, and 2-trichloromethyl-3-amino-6-(p-methoxy) styryl-s-triazine.

Specific examples of the 2-(naphtho-1-yl)-4,6-bis-halogenated methyl-s-triazine compound are, for instance, 2-(naphtho-1-yl)-4,6-bistrichloromethyl-s-triazine, 2-(4- methoxy-naphtho-1-yl)-4,6-bistrichloromethyl-s-triazine, 2-(4-ethoxy-naphtho-1-yl)-4,6-bis-trichloromethyl-s-triazine, 2-(4-butoxy-naphtho-1-yl)-4,6-bistrichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bistrichloromethyl-s-triazine, 2-[4-(2-butoxyethyl)-naphtho-1-yl]-4,6-bistrichloromethyl-s-triazine, 2-(2-methoxy-naphtho-1-yl)-4,6-bistrichloromethyl-s-triazine, 2-(6-methoxy-5-methyl-naphtho-2-yl)-4,6-bis-trichloromethyl-s-triazine, 2-(6-methoxynaphtho-2-yl)-4,6-bistrichloromethyl-s-triazine, 2-(5-methoxy-naphto-1-yl)-4,6-bistrichloromethyl-s-triazine, 2-(4,7-dimethoxy-naphtho-1-yl)-4,6-bistrichloromethyl-s-triazine, 2-(6-ethoxy-naphtho-2-yl)-4,6-bistrichloromethyl-s-triazine, and 2-(4,5-dimethoxy-naphtho-1-yl)-4,6-bistrichloromethyl-s-triazine.

Specific examples of the 4-(p-aminophenyl)-2,6-di-halogenated methyl-s-triazine compound are, for instance, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl) carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and 2,4-di(trichloromethyl)-6-[3-bromo-4-[N,N-di(ethoxycarbonylmethyl)amino]phenyl]-1,3,5-triazine.

The triazine compound preferably is, for instance, 4-[m-bromo-p-N,N-di(ethoxycarbonylmethyl)aminophenyl]-2,6-di(trichloromethyl)-s-triazine or 2,4-bis(trichloromethyl)-6-p-methoxystyryl-s-triazine. The triazine compound can be used individually or in combination, depending on actual demand.

Specific examples of the acetophenone compound are, for instance, p-dimethylamino-acetophenone, $\alpha,\alpha'$-dimethoxyzoxy-acetophenone, 2,2'-dimethyl-2-phenyl-acetophenone, p-methoxy-acetophenone, 2-methyl-1-(4-methylthio phenyl)-2-morpholino-1-propanone, and 2-benzyl-2-N,N-dimethylamino-1-(4-morpholinophenyl)-1-butanone. The acetophenone compound preferably is, for instance, 2-methyl-1-4-(methylthiophenyl)-2-morpholino-1-propanone or 2-benzyl-2-N,N-dimethylamino-1-(4-morpholinophenyl)-1-butanone. The acetophenone compound can be used individually or in combination, depending on actual demand.

Specific examples of the biimidazole compound include, for instance, 2,2'-bis(o-chlorophenyl)-4,4',5,5'-tetraphenyl-biimidazole, 2,2'-bis(o-fluorophenyl)-4,4',5,5'-tetraphenyl-biimidazole, 2,2'-bis(o-methyl phenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, and 2,2'-bis(2,4-dichlorophenyl)-4,4',5,5'-tetraphenyl-biimidazole. The biimidazole compound is preferably 2,2'-bis(2,4-dichlorophenyl)-4,4',5,5'-tetraphenyl-biimidazole. The biimidazole compound can be used individually or in combination, depending on actual demand.

Specific examples of the benzophenone compound are, for instance, thioxanthone, 2,4-diethylthioxanthone, thioxanthone-4-sulfone, benzophenone, 4 4'-bis(dimethylamino) benzophenone, and 4,4'-bis(diethylamino)benzophenone. The benzophenone compound is preferably 4,4'-bis(diethylamino)benzophenone. The benzophenone compound can be used individually or in combination, depending on actual demand.

Specific examples of the a-diketone compound are, for instance, benzil. The ketone alcohol compound is, for instance, benzoin. The ketone alcohol ether compound is, for instance, benzoin methyl ether, benzoin ethyl ether, or benzoin iso-propyl ether. The acylphosphine oxide compound is, for instance, 2,4,6-trimethylbenzoyl diphenyl phosphine oxide or bis-(2,6-dimethoxybenzoyl)-2,4,4-trimethyl benzyl phosphine oxide. The quinone compound is, for instance, anthraquinone or 1,4-naphthoquinone. The halogen-containing compound is, for instance, phenacyl chloride, tribromomethyl phenylsulfone, or tri(trichloromethyl)-s-triazine. The peroxide compound is, for instance, di-tert-butyl peroxide. The $\alpha$-diketone compound, ketone alcohol compound, ketone alcohol ether compound, acylphosphine oxide compound, quinone compound, halogen-containing compound, and peroxide compound can be used individually or in combination, depending on actual demand.

The usage quantity of the photo initiator (C) of the invention can be adjusted depending on demand. Based on 100 parts by weight of the alkali-soluble resin (A), the usage quantity of the photo initiator (C) is preferably 10 parts by weight to 100 parts by weight, more preferably 15 parts by weight to 90 parts by weight, and even more preferably 20 parts by weight to 80 parts by weight.

Solvent (D)

The solvent (D) of the invention is preferably able to dissolve the alkali-soluble resin (A), the compound (B) containing an ethylenically unsaturated group, and the photo initiator (C), not interact with the components described above, and has a suitable volatility.

Specific examples of the solvent (D) are, for instance, alkylene glycol monoalkyl ether compounds such as ethylene glycol monomethyl ether, ethylene glycol monoethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; alkylene glycol monoalkyl ether acetate compounds such as ethylene glycol methyl ether acetate, ethylene glycol ethyl ether acetate, propylene glycol methyl ether acetate, and propylene glycol ethyl ether acetate; other ether compounds such as diethylene glycol dimethyl ether, diethylene glycol methyl ethyl ether, diethylene glycol diethyl ether, and tetrahydrofuran; ketone compounds such as methyl ethyl ketone, cyclohexanone, 2-heptanone, and 3-heptanone or diacetone alcohol; alkyl lactate compounds such as methyl lactate and ethyl lactate; other ester compounds such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate, ethyl ethoxyacetate, ethyl hydroxyacetate, methyl 2-hydroxy-3-methylbutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxybutyrate; aromatic hydrocarbons such as toluene and xylene; carboxylic amines such as N-methylpyrrolidone, N,N-dimethylformamide, and N,N-dimethylacetamide; or any combination thereof. The solvent (D) can generally be used individually or in combination.

Based on a usage quantity of 100 parts by weight of the alkali-soluble resin (A), the usage quantity of the solvent (D) is preferably 1,000 parts by weight to 5,000 parts by weight, more preferably 1,300 parts by weight to 4,500 parts by weight, and even more preferably 1,500 parts by weight to 4,000 parts by weight.

Black Pigment (E)

The black pigment (E) suitable for the invention is preferably a black pigment having heat-resistance, light-resistance, and solvent-resistance.

Specific examples of the black pigment (E) are, for instance, organic black pigments such as perylene black, cyanine black, and aniline black; a near-black mixture of organic pigments obtained by mixing two or more organic pigments selected from, for instance, red, blue, green, purple, yellow, cyanine, and magenta pigment; shading materials such as carbon black, chromium oxide, ferric oxide, titanium black, and graphite, wherein the carbon black can contain, but not limited to, for instance, C.I. pigment black 7, such as products manufactured by Mitsubishi Chemical Co. (product names MA100, MA230, MA8, #970, #1000, #2350, and #2650). The black pigment (E) can generally be used individually or in combination.

Based on a usage quantity of 100 parts by weight of the alkali-soluble resin (A), the usage quantity of the black pigment (E) is preferably 100 parts by weight to 500 parts by weight, more preferably 130 parts by weight to 450 parts by weight, and even more preferably 150 parts by weight to 400 parts by weight.

Additive (F)

Without affecting the efficacy of the invention, the additive (F) can optionally be further added to the photosensitive resin composition of the invention. The additive (F) contains, but is not limited to, for instance, a surfactant, a filler, an adhesion promoting agent, a cross-linking agent, an antioxidant, an anti-coagulant, or other polymers that can improve any property (such as mechanical property).

The surfactant can be selected from the group consisting of a cationic, an anionic, a nonionic, a zwitterionic, a polysiloxane, and a fluoro surfactant, or any combination thereof. Specifically, the surfactant can contain, but not limited to, polyoxyethylene alkyl ethers such as polyoxyethylene lauryl ether, polyoxyethylene stearyl ether, or polyoxyethylene oleyl ether; polyoxyethylene alkyl phenyl ethers such as polyoxyethylene octyl phenyl ether or polyoxyethylene nonyl phenyl ether; polyethylene glycol diesters such as polyethylene glycol dilaurate and polyethylene glycol distearate; sorbitol anhydride fatty acid esters; fatty acid-modified polyesters; and tertiary amine-modified polyurethanes. The surfactant can be used individually or in combination.

Specific examples of the surfactant are, for instance, KP (manufactured by Shin-Etsu Chemical Co., Ltd.), SF-8427 (manufactured by Toray Dow Corning Silicone Co., Ltd.), Polyflow (manufactured by Kyoeisha Oil Chemical Co., Ltd.), F-Top (manufactured by Tochem Product Co., Ltd.), Megafac (manufactured by Dainippon Ink and Chemicals (DIC) Co., Ltd.), Fluorade (manufactured by Sumitomo 3M, Ltd.), Asahi Guard (manufactured by Asahi glass Co., Ltd.), Surflon (manufactured by Asahi glass Co., Ltd.), or SINOPOL E8008 (manufactured by Sino-Japan Chemical Co., Ltd.).

The filler can be, for instance, glass or aluminium, but is not limited thereto.

Specific examples of the adhesion promoting agent are, for instance, vinyltrimethoxysilane, vinyltriethoxysilane, vinyltris(2-methoxyethoxy)silane, N-(2-amino ethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldiethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyl trimethoxysilane and 3-mercaptopropyltrimethoxysilane.

Specific examples of the antioxidant are, for instance, 2,2-thiobis(4-methyl-6-t-butyl phenol) or 2,6-di-t-butyl phenol.

Specific example of the anti-coagulant is, for instance, sodium polyacrylate.

Specific examples of the cross-linking agent are, for instance, epoxy compounds such as 1031S and 157S-70 manufactured by Japan Epoxy Resins Co., Ltd, or resins.

Based on a total amount of 100 parts by weight of the alkali-soluble resin (A), the content range of the filler, the adhesion promoting agent, the antioxidant, the anti-coagulant, or polymers other than the alkali-soluble resin (A) in the additive (F) is preferably 10 parts by weight or less, and more preferably 6 parts by weight or less.

Based on a total amount of 100 parts by weight of the alkali-soluble resin (A), the content range of the surfactant in the additive (F) is preferably 6 parts by weight or less, and more preferably 4 parts by weight or less.

Based on a total amount of 100 parts by weight of the alkali-soluble resin (A), the content range of the cross-linking agent in the additive is preferably 100 parts by weight or less, and more preferably 80 parts by weight or less.

Preparation Method of Photosensitive Resin Composition

The photosensitive resin composition of the invention is prepared by, for instance, placing and stirring the alkali-soluble resin (A), the compound (B) containing an ethylenically unsaturated group, the photo initiator (C), the solvent (D), and the black pigment (E) in an agitator such that the ingredients are evenly mixed into a solution state. When necessary, the additive (F) such as the surfactant, the filler, the adhesion promoting agent, the cross-linking agent, the antioxidant, and the anti-coagulant can be added. After the solution is evenly mixed, the photosensitive resin composition in solution state can be obtained.

Based on a usage quantity of 100 parts by weight Of the alkali-soluble resin (A), the usage quantity of the resin (A-1) having an unsaturated group is preferably 30 parts by weight to 100 parts by weight, the usage quantity of the compound (B) containing an ethylenically unsaturated group is preferably 20 parts by weight to 200 parts by weight, the usage quantity of the photo initiator (C) is 10 parts by weight to 100 parts by weight, the usage quantity of the solvent (D) is preferably 1,000 parts by weight to 5,000 parts by weight, and the usage quantity of the black pigment (E) is preferably 100 parts by weight to 500 parts by weight.

In actuality, the preparation method of the photosensitive resin composition of the invention is not particularly limited. For instance, the black pigment (E) can be directly added and dispersed in other ingredients of the photosensitive resin composition in order to form the photosensitive resin composition. Alternately, a portion of the pigment (E) can first be dispersed in a portion of a medium including the alkali-soluble resin (A) and the solvent (D) to form a pigment dispersion solution, and then mixing with the rest of the compound (B) containing an ethylenically unsaturated group, the photo initiator (C), the alkali-soluble resin (A), and the solvent (D) to prepare the photosensitive resin composition. The dispersion steps of the black pigment (E) can be performed by mixing the ingredients with a mixer such as a beads mill or a roll mill.

Preparation Method of Black Matrix

The black matrix of the invention can be prepared by performing, in sequence, the treatments of pre-baking, exposure, development, and post exposure baking (PEB) to the photosensitive resin composition. The film thickness of the black matrix formed can vary depending on the application. Specifically, when applying the black matrix to an LCD, the film thickness is, for instance, in the range of 0.8 μm to 1.2 μm, but is not limited thereto. When applying the black matrix to a touch panel, the film thickness is, for instance, in the range of 1.5 μm to 2.5 μm, but is not limited thereto. In particular, when the film thickness is 1 μm, the optical density range of the black matrix is preferably 3.0 or more, more preferably 3.2 to 5.5, and even more preferably 3.5 to 5.5.

More specifically, the black matrix of the invention can form a pre-baked coating film on a substrate by coating the photosensitive resin composition on the substrate through a coating method such as spin-coating or cast coating and then removing the solvent through reduced pressure drying and a pre-bake treatment. The conditions of the reduced pressure drying and pre-bake can be specified based on the type and the mix ratio of each ingredient. Generally, the reduced pressure drying can be performed at a pressure of less than 200 mmHg for 1 second to 20 seconds and the pre-bake treatment can be performed at a temperature of 70° C. to 110° C. for 1 minute to 15 minutes. After the pre-bake treatment, the coating film is exposed by a specified mask, and the unnecessary portion is removed by immersing the exposed coating film in a developing solution at a temperature of 23±2° C. for 15 seconds to 5 minutes so as to form a specific pattern. The light used in the exposure step is preferably an ultraviolet light such as a g-line, an h-line, or an i-line, and the ultra-violet irradiation device can be, for instance, a(n) (ultra-)high pressure mercury vapor lamp or a metal halide lamp.

Specific examples of the developing solution are, for instance, solutions of basic compounds such as sodium hydroxide, potassium hydroxide, sodium carbonate, sodium hydrogen carbonate, potassium carbonate, potassium hydrogen carbonate, sodium silicate, sodium methyl silicate, aqueous ammonia, ethylamine, diethylamine, dimethyl ethanolamine, tetramethylammonium hydroxide, tetraethylammonium hydroxide, choline, pyrrole, piperidine, and 1,8-diazabicyclo-[5,4,0]-7-undecene. The concentration of the developing solution is generally 0.001 wt % to 10 wt %, preferably 0.005 wt % to 5 wt %, and more preferably 0.01 wt % to 1 wt %.

Generally, after treatment with the developing solution, the pattern is first washed with water and then air-dried with compressed air or compressed nitrogen. Next, a heating device such as a hot plate or an oven is used to perform the post-bake treatment. The temperature of the post-bake is generally in the range of 150° C. to 250° C., wherein the heating time is about 5 minutes to 60 minutes when the hot plate is used and about 15 minutes to 150 minutes when the oven is used. After the treatment steps, the black matrix can be formed on the substrate.

Specific examples of the substrate are, for instance, an alkali-free glass, a soda-lime glass, a hard glass (such as Pyrex glass), and a silica glass used in a liquid crystal display device, and such glasses with a transparent conductive film attached thereon; or a substrate such as a photoelectric conversion device substrate (such as a silicon substrate) used in, for instance, a solid imaging device.

Preparation Method of Pixel Layer and Color Filter

The formation method of the color filter of the invention can be performed by coating the photosensitive composition for a color filter, which is mixed into a solution state, on a substrate by a coating method such as spin-coating, cast coating, or roll coating, wherein the black matrix for separating each pixel color layer is formed on the substrate in advance by using the photosensitive resin composition. After coating, most of the solvent is removed by a method of reduced pressure drying, and then the solvent is removed by pre-baking to form a pre-baked coating film.

The conditions of the reduced pressure drying and pre-bake can be specified based on the type and the mix ratio of each ingredient. Generally, the reduced pressure drying can be performed at a pressure of 0 mmHg to 200 mmHg for 1 second to 60 seconds, and the pre-bake can be performed at a temperature of 70° C. to 110° C. for 1 minute to 15 minutes. After the pre-bake, the coating film is exposed by a specified mask, and the unnecessary portion is removed by immersing and developing the exposed coating film in a developing solution at a temperature of 23±2° C. for 15 seconds to 5 minutes to form a specific pattern. The light used in the exposure step is preferably an ultraviolet light such as a g-line, a h-line, or an i-line, and the ultra-violet irradiation device can be, for instance, a(n) (ultra-)high pressure mercury vapor lamp or a metal halide lamp.

After development, the pattern is first washed with water and then air-dried with compressed air or compressed nitrogen, and then a heating device such as a hot plate or an oven is used to perform the post-bake treatment. The conditions of the post-bake treatment are the same as described above and are not repeated herein.

The steps are repeated in sequence for the photosensitive composition of each color (mainly including red, green, and blue) to prepare the pixel layer of the color filter. Next, in a vacuum environment with a temperature in the range of 220° C. to 250° C., an indium tin oxide (ITO) film is formed on the pixel layer. When needed, after the ITO film is etched and wired, a polyimide for a liquid crystal alignment film is coated and burned to obtain the color filter for a liquid crystal display device.

Preparation Method of Liquid Crystal Display Device

The liquid crystal display device of the invention can be formed by the following method: the color filter substrate formed by the preparation method of the color filter and a driving substrate with a thin film transistor (TFT) are placed opposite to each other with a gap (cell gap) between the two, and then the surrounding area of the two substrates is laminated with a sealing agent. Next, a liquid crystal is injected into the gap separated by the surface of the substrates and the sealing agent to seal the injection hole and to form a liquid crystal cell. Then, a polarizer is laminated to the outer surface of the liquid crystal cell, i.e. the other side surfaces of each of the substrates forming the liquid crystal cell so as to fabricate the liquid crystal display device.

The liquid crystal can be a liquid crystal compound or a liquid crystal composition. The specific composition of the liquid crystal is not particularly limited, and any liquid crystal compound and liquid crystal composition known by those skilled in the art can be used.

Moreover, the liquid crystal alignment film is used to limit the alignment of the liquid crystal molecules and is not particularly limited, and can be any inorganic matter or organic matter. Furthermore, the technique of forming the liquid crystal alignment film is well known by those skilled in the art and is thus not repeated herein.

In the following, the implements of the invention are further illustrated through a variety of embodiments. However, it should be understood that the following embodiments are only exemplary illustrations of the preparation method and effect of the photosensitive resin composition and the black matrix formed thereby and are not intended to limit the scope of the invention.

Experimental Examples

Preparation of Photosensitive Resin Composition

The photosensitive resin composition of each of embodiment 1 to embodiment 7 and comparative example 1 to comparative example 2 were prepared by the preparation method of the photosensitive resin composition described above and according to the conditions in the following Table 1.

In Table 1, compound (B-1-1) is 2,2,4,4,6,6-hexa[2-(methacryloyloxy)-phenoxy]-cyclotriphosphazene; compound (B-1-2) is 2,2,4,4,6,6-hexa[2-(acryloyloxy)-phenoxy]-cyclotriphosphazene; compound (B-1-3) is 2,2,4,4,6,6-hexa[2-(methacryloyloxy)-ethoxy]-cyclotriphosphazene (product name: PPZ; manufactured by Kyoeisha Chemical Co., LTD); compound (B-1-4) is 2,2,4,4,6,6-hexa[2-(acryloyloxy)-ethoxy]-cyclotriphosphazene; compound (B-1-5) is 2,2,4,4,6,6-hexa[2-(methacryloyloxy)-propenyloxy]-cyclotriphosphazene; compound (B-1-6) is 2,2,4,4,6,6-hexa[2-(methacryloyloxy)-propenyl phenoxy]-cyclotriphosphazene; compound (B-2-1) is trimethylolpropyl triacrylate; compound (B-2-2) is dipentaerythritol tetraacrylate; compound (B-2-3) is dipentaerythritol hexaacrylate; photo initiator (C-1) is 1-[9-ethyl-6-(2-methylbenzoyl)-9H-carbazol-3-yl]-ethanone 1-(O-acetyloxime) (product name: OXE-02; manufactured by Ciba Specialty Chemicals Inc.); photo initiator (C-2) is 1-[4-(phenylthio)phenyl]octane-1,2-dione 2-(O-benzoyl-oxime) (product name: OXE-01; manufactured by Ciba Specialty Chemicals Inc.); photo initiator (C-3) is 2-methyl-1-[4-methylthio)phenyl]-2-morpholino-1-propanone (product name: IRGACURE 907; manufactured by Ciba Specialty Chemicals Inc.); solvent (D-1) is propylene glycol methyl ether acetate; solvent (D-2) is ethyl 3-ethoxypropanoate; black pigment (E-1) is a pigment with the product name MA100 (manufactured by Mitsubishi Chemical Corporation); and black pigment (E-2) is a pigment with the product name MA230 (manufactured by Mitsubishi Chemical Corporation).

The synthesis method of each of alkali-soluble resin (A-1-1) to alkali-soluble resin (A-2-2) used in each experimental example are illustrated in the following.

Synthesis of Alkali-Soluble Resin (A)

Synthesis Example 1

Preparation Method of Resin (A-1-1) Having an Unsaturated Group

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 6 parts by weight of tetrahydrophthalic anhydride and 13 parts by weight of benzophenonetetracarboxylic dianhydride (BTDA) were added, and then the mixture solution was heated to 110° C. to 115° C. and reacted for 2 hours to obtain the resin (A-1-1) having an unsaturated group, wherein the resin (A-1-1) having an unsaturated group had an acid value of 98.0 mgKOH/g.

Synthesis Example 2

Preparation Method of Resin (A-1-2) Having an Unsaturated Group

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 13 parts by weight of BTDA was added, and then the mixture solution was reacted for 2 hours at 90° C. to 95° C. Then, 6 parts by weight of tetrahydrophthalic anhydride was added, and the mixture solution was reacted for 4 hours at 90° C. to 95° C. to obtain the resin (A-1-2) having an unsaturated group, wherein the resin (A-1-2) having an unsaturated group had an acid value of 99.0 mgKOH/g.

Synthesis Example 3

Preparation Method of Resin (A-1-3) Having an Unsaturated Group

A reaction vessel was added with 400 parts by weight of an epoxy compound (Model NC-3000, manufactured by Nippon Kayaku Co. Ltd.; epoxy equivalent 288), 102 parts by weight of acrylic acid, 0.3 parts by weight of methoxyphenol, 5 parts by weight of triphenyl phosphine, and 264 parts by weight of propylene glycol methyl ether acetate, wherein the temperature was maintained at 95° C. and the mixture was reacted for 9 hours to obtain an intermediate product having an acid value of 2.2 mgKOH/g. Then, 151 parts by weight of tetrahydrophthalic anhydride was added and the mixture was reacted for 4 hours at 95° C. to obtain the resin (A-1-3) having an acid value of 102 mgKOH/g and a weight average molecular weight of 3,200.

Synthesis Example 4

Preparation Method of Other Alkali-Soluble Resin(s) (A-2-1)

A round-bottomed flask installed with a stirrer and a condenser was added with 1 part by weight of 2,2'-azobisisobutyronitrile, 240 parts by weight of propylene glycol methyl ether acetate, 20 parts by weight of methacrylic acid, 15 parts by weight of styrene, 35 parts by weight of benzyl methacrylate, 10 parts by weight of glycerol monomethacrylate, and 20 parts by weight of N-phenylmaleimide, and the interior of the flask was filled up with nitrogen. Then, the flask was slowly stirred and the temperature was raised to 80° C. to evenly mix each reactant, and a polymerization reaction was performed for 4 hours. Then, the temperature of the reactants was raised to 100° C., and 0.5 parts by weight of 2,2'-azobisisobutyronitrile was added. After polymerization was performed for 1 hour, the alkali-soluble resins (A-2-1) could be obtained.

Synthesis Example 5

Preparation Method of Other Alkali-Soluble Resin (A-2-2)

A round-bottomed flask installed with a stirrer and a condenser was added with 2 parts by weight of 2,2'-azobisisobutyronitrile, 300 parts by weight of propylene glycol methyl ether acetate, 15 parts by weight of methacrylic acid, 15 parts by weight of 2-hydroxy ethyl acrylate, and 70 parts by weight of benzyl methacrylate, and the interior of the flask was filled up with nitrogen. Then, the flask was slowly stirred and the temperature was raised to 80° C. to evenly mix each reactant, and a polymerization reaction was performed for 3 hours. Then, the temperature of the reactants was raised to 100° C., and 0.5 parts by weight of 2,2'-azobisisobutyronitrile was added. After polymerization was performed for 1 hour, the alkali-soluble resin (A-2-2) could be obtained.

<Formation of Black Matrix>

Each of the photosensitive resin compositions prepared according to the conditions of Table 1 was placed in a coater (Model MS-A150; purchased from Hsin Kong Trade Co., Ltd.) and was coated on a glass substrate having a size of 100 mm×100 mm by a method of spin-coating, followed by reduced pressure drying at a pressure of 100 mmHg for 5 seconds. Then, the glass substrate with the photosensitive resin compositions was pre-baked at 100° C. for 2 minutes to form a pre-baked coating film having a film thickness of 1.2 Then, the pre-baked coating film was irradiated by an ultraviolet light (exposure machine model: AG500-4N; manufactured by M&R Nano Technology) at an energy density of 100 mJ/cm$^2$, and then the pre-baked coating film was immersed in a developing solution (0.04% potassium hydroxide) at 23° C. for 2 minutes. After washing with pure water, the pre-baked coating film was post baked in an oven at 230° C. for 60 minutes. The black matrix (or shading film) having a film thickness of 1.0 μm was thus formed on the glass substrate.

<Evaluation Method>

Reliability Under, Conditions of High Temperature and High Humidity

The black matrix (shading film) was placed in an oven at 121° C., 2 atm, and RH=100% for 8 hours, and according to the 8.5.2 cross-cut tape test method of JIS-5400(1900)8.5 adhesiveness, the black matrix of each of the experimental examples and comparative examples obtained was cut into 100 squares with a small knife, and tape was stuck to the squares and torn off to observe the squares remaining without being peeled off. The reliability was evaluated using the following criteria:

⊚: 5B;
○: 4B;
Δ: 3B to 2B; and
X: 1B to 0B;
wherein 5B represents no square peeled off;
4B represents 0%<number of squares peeled off≤5%;
3B represents 5%<number of squares peeled off≤15%;
2B represents 15%<number of squares peeled off≤35%;
1B represents 35%<number of squares peeled off≤65%;
0B represents 65%<number of squares peeled off≤100%.

The evaluation results of each of the black matrices are as shown in the following Table 1.

TABLE 1

| Ingredient | | | Embodiment 1 | 2 | 3 | 4 | 5 | 6 | 7 | Comparative Example 1 | 2 |
|---|---|---|---|---|---|---|---|---|---|---|---|
| Alkali-soluble resin (A) (parts by weight) | A-1 | A-1-1 | 100 | | | 30 | | | | 100 | |
| | | A-1-2 | | 100 | | | 50 | | | | 80 |
| | | A-1-3 | | | 100 | | | 70 | | | |
| | A-2 | A-2-1 | | | | 70 | | 30 | 100 | | 20 |
| | | A-2-2 | | | | | 50 | | | | |
| Compound (B) containing an ethylenically unsaturated group (parts by weight) | B-1 | B-1-1 | 10 | | | | | | 75 | | |
| | | B-1-2 | | 10 | | | | | | | |
| | | B-1-3 | | | 30 | | | | 75 | | |
| | | B-1-4 | | | | 80 | | | | | |
| | | B-1-5 | | | | | 100 | | | | |
| | | B-1-6 | | | | | | 120 | | | |

TABLE 1-continued

| Ingredient | | | 1 | 2 | 3 | 4 | 5 | 6 | 7 | Comparative Example 1 | Comparative Example 2 |
|---|---|---|---|---|---|---|---|---|---|---|---|
| | B-2 | B-2-1 | | 10 | | | | | | 50 | |
| | | B-2-2 | | | | | | | 50 | | |
| | | B-2-3 | | | 30 | | | | | | 100 |
| Photo initiator (C) | C-1 | | 10 | | | 80 | | 30 | | 30 | |
| (parts by weight) | C-2 | | | 30 | | | 90 | | 100 | | 15 |
| | C-3 | | | | 60 | | | 70 | | | |
| Solvent (D) | D-1 | | 1000 | | 1500 | 2500 | | 4000 | 3000 | 2500 | |
| (parts by weight) | D-2 | | | 1500 | 500 | | 3000 | | 2000 | | 3000 |
| Black pigment (E) | E-1 | | 100 | 150 | | | 300 | 400 | 400 | | 300 |
| (parts by weight) | E-2 | | | | 200 | 250 | | | 100 | 200 | |
| Evaluation results | Reliability | | ◎ | ◎ | ◎ | ◎ | ◎ | ◎ | ○ | X | X |

From the results shown in Table 1, in comparison to comparative example 1 and comparative example 2, the black matrix of each of embodiment 1 to embodiment 7 obviously has better reliability under the conditions of high temperature and high humidity, and the black matrix of each of embodiment 1 to embodiment 6 has the best evaluation results.

In particular, although the reliability of embodiment 7 without the alkali-soluble resin (A-1) is in a better range under the conditions of high temperature and high humidity, the evaluation is slightly worse in comparison to embodiment 1 to embodiment 6, revealing the addition of the resin (A-1) having an unsaturated group also helps to improve the reliability under the conditions of high temperature and high humidity.

Additionally, if the compound (B-1) containing an ethylenically unsaturated group is not used at all in the photosensitive resin composition, then the reliability of the black matrix formed by using the composition under the conditions of high temperature and high humidity is not good. Therefore, adding the compound (B-1) containing an ethylenically unsaturated group can effectively and significantly improve the reliability of the black matrix under the conditions of high temperature and high humidity.

Based on the above, the photosensitive resin composition provided in the invention has good reliability under the conditions of high temperature and high humidity, and good display characteristics can be obtained when the photosensitive resin composition is used in a black matrix, a color filter, and a liquid crystal display device.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A photosensitive resin composition, comprising:
an alkali-soluble resin (A);
a compound (B) containing an ethylenically unsaturated group;
a photo initiator (C);
a solvent (D); and a black pigment (E);
wherein the compound (B) containing an ethylenically unsaturated group contains a compound (B-1) represented by the following formula (I), and compound (B-2) containing an ethylenically unsaturated group selected from the group consisting of a compound having one ethylenically unsaturated group and a compound having two or more ethylenically unsaturated groups,

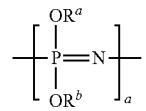

Formula (1)

in formula (I), a represents an integer of 1 to 20; each of $R^a$ and $R^b$ independently represents an acryloyloxy phenyl group, an acryloyloxy alkyl group having 4 to 20 carbons, a methacryloyloxy phenyl group, a methacryloyloxy alkyl group having 5 to 20 carbons, an alkenyl group having 3 to 20 carbons, or an alkenyl awl group having 8 to 30 carbons; when a is 2 or more, a plurality of $R^a$ and $R^b$ are the same or different, wherein based on 100 parts by weight of the alkali-soluble resin (A), a usage quantity of the compound (B-1) containing an ethylenically unsaturated group shown in formula (I) is 10 to 150 parts by weight.

2. The photosensitive resin composition of claim 1, wherein the alkali-soluble resin (A) comprises a resin (A-1) having an unsaturated group, the resin (A-1) having an unsaturated group is prepared from a polymerization performed on a mixture, and the mixture contains an epoxy compound (i) having at least two epoxy groups and a compound (ii) having at least one carboxylic acid group and at least one ethylenically unsaturated group.

3. The photosensitive resin composition of claim 2, wherein the epoxy compound (i) having at least two epoxy groups has a structure as shown in the following formula (I) or formula (II):

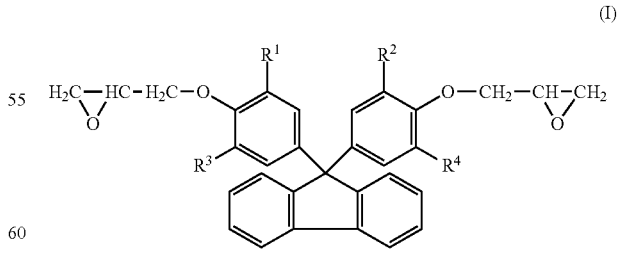

(I)

in formula (I), $R^1$, $R^2$, $R^3$ and $R^4$ are respectively the same or different and represent a hydrogen atom, a halogen atom, an alkyl group having 1 to 5 carbons, an alkoxy group having 1 to 5 carbons, an aryl group having 6 to 12 carbons, or an aralkyl group having 6 to 12 carbons;

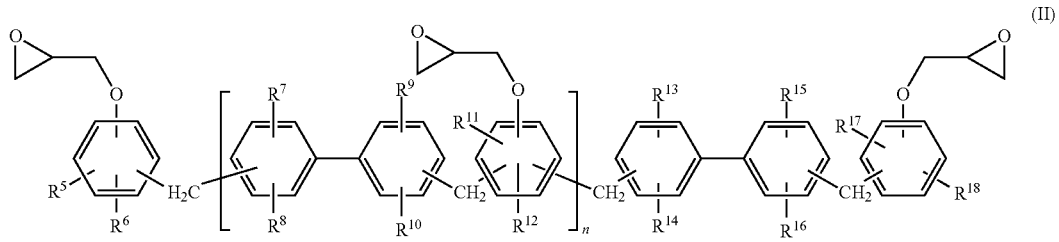
(II)

in formula (II), $R^5$ to $R^{18}$ are respectively the same or different and represent a hydrogen atom, a halogen atom, an alkyl group having 1 to 8 carbons, or an aryl group having 6 to 15 carbons, and n represents an integer of 0 to 10.

4. A black matrix formed by the photosensitive resin composition of claim 3.

5. The photosensitive resin composition of claim 2, wherein based on 100 parts by weight of the alkali-soluble resin (A), a usage quantity of the resin (A-1) having an unsaturated group is 30 to 100 parts by weight.

6. A black matrix formed by the photosensitive resin composition of claim 5.

7. A black matrix formed by the photosensitive resin composition of claim 2.

8. The photosensitive resin composition of claim 1, wherein based on 100 parts by weight of the alkali-soluble resin (A), a usage quantity of the compound (B) containing an ethylenically unsaturated group is 20 to 200 parts by weight; a usage quantity of the photo initiator (C) is 10 to 100 parts by weight; a usage quantity of the solvent (D) is 1,000 to 5,000 parts by weight; and a usage quantity of the black pigment (E) is 100 to 500 parts by weight.

9. A black matrix formed by the photosensitive resin composition of claim 8.

10. A black matrix formed by the photosensitive resin composition of claim 1.

11. A color filter containing the black matrix of claim 10.

12. A liquid crystal display device containing the color filter of claim 11.

* * * * *